United States Patent [19]

Sullenberger

[11] Patent Number: 4,845,431

[45] Date of Patent: Jul. 4, 1989

[54] VARIABLE APERTURE, VARIABLE FREQUENCY EXTREMITY COIL FOR MAGNETIC RESONANCE IMAGING

[75] Inventor: Peter C. Sullenberger, Langhorne, Pa.

[73] Assignee: University of Pittsburgh, Pittsburgh, Pa.

[21] Appl. No.: 169,843

[22] Filed: Mar. 18, 1988

[51] Int. Cl.⁴ .............................. G01R 33/20
[52] U.S. Cl. ................................. 324/318; 324/314
[58] Field of Search ............... 128/653; 324/300, 307, 324/309, 318, 319, 320, 200, 260, 262, 314; 336/20

[56] References Cited

U.S. PATENT DOCUMENTS

| | | | |
|---|---|---|---|
| 4,587,493 | 5/1986 | Sepponen | 324/318 |
| 4,673,882 | 6/1987 | Buford | 324/318 |
| 4,771,785 | 9/1988 | Duer | 324/318 |

*Primary Examiner*—Michael J. Tokar
*Attorney, Agent, or Firm*—Reed Smith Shaw & McClay

[57] ABSTRACT

The present invention pertains to an extremity coil for magnetic resonance imaging. The extremity coil includes means for varying the aperture of the coil, and means for supporting the coil. Additionally, the extremity coil can include means for varying the resonant frequency of the coil.

11 Claims, 5 Drawing Sheets

VARIABLE APERTURE, VARIABLE FREQUENCY EXTREMITY COIL FOR MAGNETIC RESONANCE IMAGING

SUMMARY OF THE INVENTION

The present invention relates to extremity coils for magnetic resonance imaging. More specifically, the present invention relates an extremity coil that can have its aperture varied as well as its resonant frequency varied.

BACKGROUND OF THE INVENTION

The present state of the art of surface and extremity coil building has many examples of efficient coils that resonate at two or even three frequencies, and that couple and decouple as RF pulses are applied. Until recently none of these coils utilized an adjustable coil geometry to vary the coil's electrical properties. W. G. Holcomb and J. C. Gore, "A Variable Frequency Birdcage Resonator For Imaging At High Field", Society of Magnetic Imaging, Tpm-C2, C3, disclose a variation of the standard cylindrical birdcage coil developed by C. E. Hayes, et al., "An Efficient, Highly Homogeneous Radiofrequency Coil For Whole-Body NMR Imaging at 1.5T", Journal of Magnetic Resonance 63, 622–628 (1965) that allows a radiologist to change the tuning capacitance and hence the resonant frequency of the coil by extending the length of the coil. This is accomplished by using concentric columns of electrically discrete copper tubing connected to opposite ends of the coil. Such a coil allows the radiologist to image samples of differing resonant frequencies without changing coils.

When a research radiologist desires to image a mouse, a rat, a rabbit, as well as a small dog, he would choose a coil providing the optimum filling factor for each. By doing so, the sample more completely fills the inside of the cylindrical coil, resulting in an improvement in the signal to noise ratio, and consequently an improvement in the images. Similarly, when a clinical radiologist images a human wrist, knee and head, he too would ideally choose different size coils for each if they were available. Often, however, the cost of either building or purchasing specialized coils is prohibitive so the radiologist must be satisfied with coils that are within easy access, and images that are second rate.

SUMMARY OF THE INVENTION

The present invention pertains to an extremity coil for magnetic resonance imaging. The extremity coil comprises means for varying the aperture of the coil, and means for supporting the coil. Additionally, the extremity coil can include means for varying the resonant frequency of the coil. In one embodiment, the extremity coil is comprised of a main cylinder which has a first plurality of slots. The first plurality of slots extends lengthwise into the main cylinder from a first end thereof. The extremity coil is also comprised of a driver plate. The driver plate is disposed in the main cylinder at the first end thereof and disposed perpendicular to the main axis of the main cylinder. The main axis of the main cylinder passes essentially through the center of the driver plate. The driver plate is capable of sliding along the slots in the main cylinder. The slots are capable of preventing the driver plate from independently rotating about the main axis of the main cylinder. The driver plate has slots which extend from a location near the main axis and which are coaxial to the main axis. Additionally, there is an end ring disposed in the main cylinder at a second end thereof. The end ring is also disposed in a plane that is perpendicular to the main axis of the cylinder. The main axis of the cylinder passes essentially through the center of the end ring. There is a plurality of spokes which extend from a location near the main axis of the main cylinder and which are coaxial to the main axis. Each of the spokes are attached to the end ring such that each spoke is able to swing in a plane that is perpendicular to the main axis. A plurality of columns are disposed in the main cylinder and are coaxial to the main axis thereof. The columns are extendable with respect to length and have a capacitance corresponding thereto for tuning the resonant frequency of the coil. Each column has a first end attached to a corresponding spoke, and a second end extending into a corresponding slot of the driver plate. The first ends of each column are electrically connected to each other and the second ends of each column are electrically connected to each other. Additionally, there is means for supporting the main cylinder.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
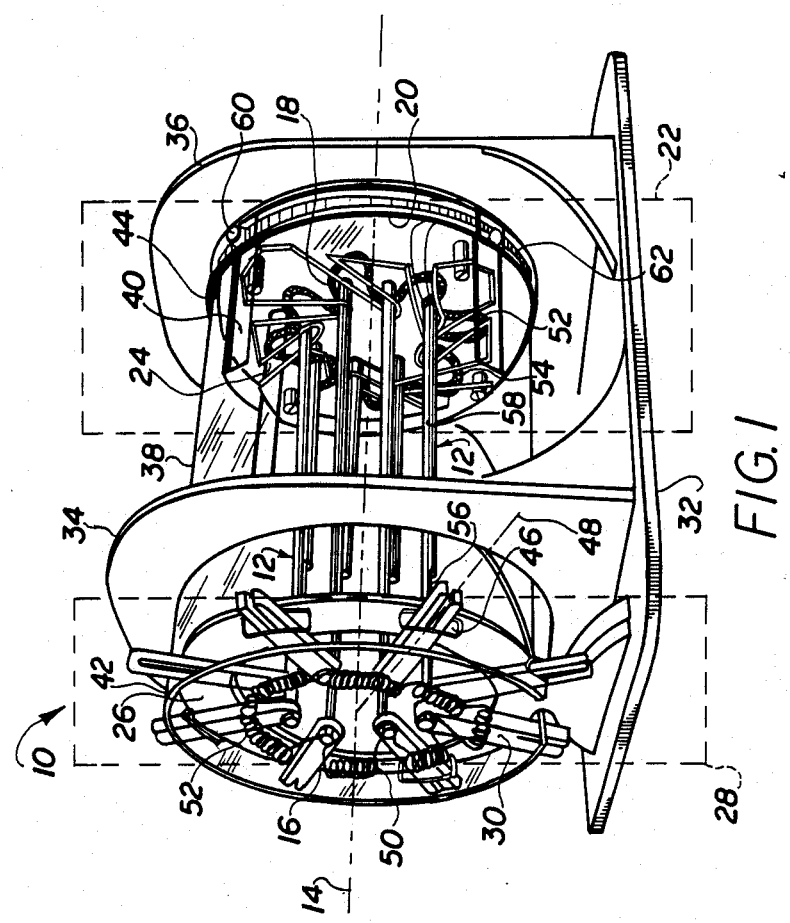
FIG. 1 is a perspective view of an extremity coil with a driver plate in a first position.

Referring now to the drawings, wherein like reference numerals designate identical or corresponding parts throughout the several views, and more particularly to FIG. 1 thereof, there is shown a perspective view of an extremity coil 10 for magnetic resonance imaging which has a variable aperture and variable frequency. The extremity coil 10 has means for varying the aperture of the coil 10 and means for supporting the coil 10. Additionally, the coil 10 can include means for varying the resonant frequency of the coil 10.

More specifically, the extremity coil 10 includes a plurality of columns 12, preferably equidistantly, disposed about a main axis 14 and essentially parallel thereto. The columns 12 are preferably disposed coaxially about the main axis 14. The columns 12 are electrically connected to each other at their first ends 16 and are also electrically connected to each other at their second ends 18. The means for varying the aperture of the coil can include means for varying the distance of the columns from the main axis 14.

The means for varying the distance of the columns 12 from the main axis 14 can include a driver plate 20 disposed in a plane 22 that is perpendicular to the main axis 14. The driver plate 20 is disposed such that the main axis 14 essentially passes through the center of the driver plate 20. The drive plate 20 preferably has a plurality of slots 24 which extend from a location near the main axis 14 and which are coaxial to the main axis 14. The second ends 18 of the columns 12 extend into corresponding slots 24 on the driver plate 20.

The means for varying the distance of the columns 12 from the main axis 14 also includes an end ring 26 disposed in a plane 28 that is perpendicular to the main axis 14. The main axis 14 essentially passes through the center of the end ring 28.

The means for varying the distance of the columns 12 from the main axis 14 also includes a plurality of spokes 30. Each of said spokes 30 extend from a location near the main axis 14 and are attached to the end ring 26 such that each spoke 30 is able to swing in a plane that is perpendicular to the main axis 14. The spokes 30 can be disposed coaxially about the main axis 14. The first ends 16 of the columns 12 are attached to corresponding spokes 30.

The support means of the extremity coil 10 can include a main support plate 32 and a first and second support ring 34 and 36, respectively, which are attached to the main support plate 32. The first and second support rings 34 and 36 are disposed about the columns 12 such that they support the columns 12.

Preferably, the extremity coil 10 includes a main cylinder 38. The main cylinder 38 has a first plurality of slots 40 which extend lengthwise into the main cylinder 38 from a first end 42 thereof. In the embodiment with the main cylinder 38 present, the driver plate 20 is disposed in the main cylinder 38 at the first end 42 thereof and disposed perpendicular to the main axis 14 of the main cylinder 38. The driver plate 20 is capable of sliding along the first plurality of slots 40 in the main cylinder 38. The first plurality of slots 40 are capable of preventing the driver plate 20 from independently rotating about the main axis 14 of the main cylinder 38.

The end ring 26 is disposed in the main cylinder 38 at a second end 44 thereof. The end ring 26 is also disposed in a plane that is perpendicular to the main axis 14 of the main cylinder 38. The main axis 14 passes essentially through the center of the end ring 26.

The plurality of columns 12 are disposed in the main cylinder 38 and are preferably equidistant to and essentially parallel to the main axis 14 thereof. The columns 12 are extendable with respect to length and have a capacitance corresponding thereto for tuning the resonant frequency of the coil.

Figure 4:
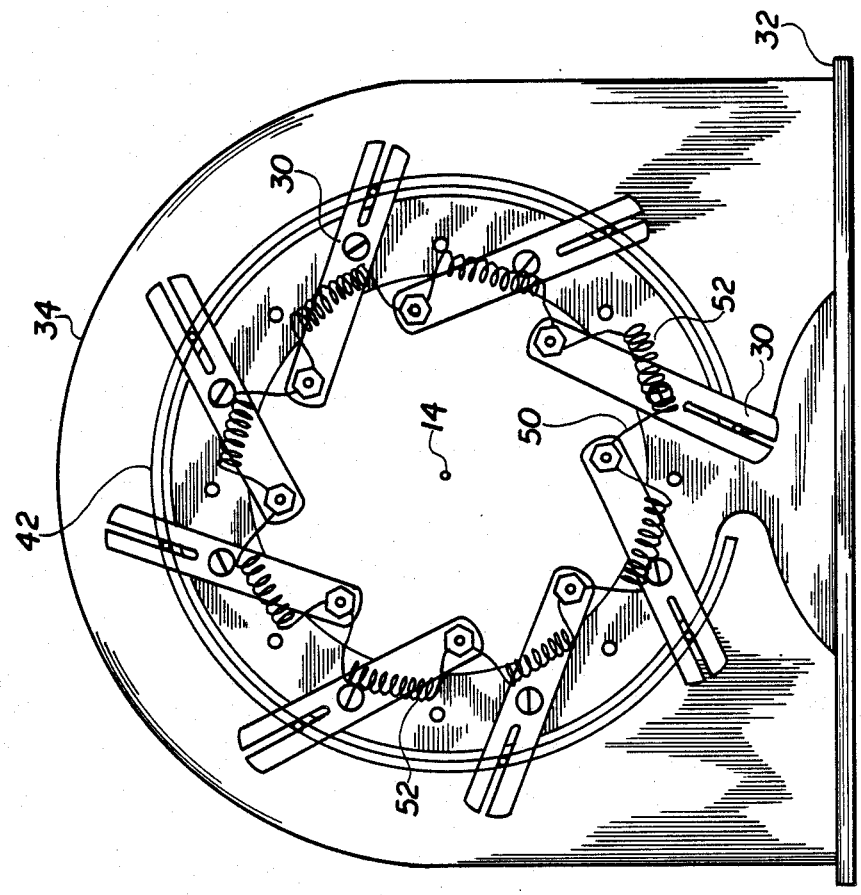
FIG. 4 is an axial view of the extremity coil having a second aperture.

The main cylinder 38 preferably also has a second plurality of slots 46 at the second end 44 thereof. Each of the spokes 30 extend from a location near the main axis 14 of the main cylinder 38 into a corresponding slot 46 of the second plurality of slots 46. The spokes 30 can be disposed coaxially about the main axis 46. Preferably, each of the second plurality of slots is large enough to allow each spoke 30 in a corresponding slot 46 to rotate approximately at an angle $\theta$ of 35° with respect to a corresponding radial arm 48 as shown in FIG. 4.

The first ends 16 of the columns 12 are preferably electrically connected to each other by a first connecting ring 50. The first connecting ring 50 is comprised of flexible inductors 52. A flexible inductor 52 is connected to the first ends 16 of adjacent columns 12. The second ends 18 of the columns 12 are electrically connected to each other by a second connecting ring 54. The second connecting ring 54 is also comprised of flexible inductors 52 (not shown). A flexible inductor 52 is connected to the second ends 18 of adjacent columns 12.

The main cylinder 38 is preferably supported by a main support plate 32 and a first and second support ring 34 and 36, respectively, which are attached to the main support plate 32. The first and second support rings 34 and 36, respectively, are disposed about the main cylinder 38 such that the main cylinder 38 is rotatably supported by the first and second support rings 34 and 36, respectively.

Preferably, the driver plate 20 has a plurality of tabs 60. Each of the tabs 60 extends through a corresponding slot 40 of the first plurality of slots 40 in the main cylinder 38. There is also preferably a driver cylinder 62 disposed about the main cylinder 38 and connected to the tabs 60 such that driver cylinder 62 can rotate and slide in concert with the driver plate 20.

In an embodiment of the coil 10 having means for varying the resonant frequency of the coil 10, the means for varying the resonant frequency of the coil 10 preferably includes an electrically conducting rod 56 and an electrically conducting tube 58 which together comprise each column 12. The rod 56 is disposed in the tube 58 and forms a capacitance therebetween. The capacitance is capable of being varied by sliding the rod 56 with respect to the tube 58, thus varying the resonant frequency of the coil. Capacitance occurs in the separation between the sliding rod 56 and the tube 58 by means of preferably Teflon TM shrink tubing that surrounds the rod. No actual contact is made between the tube and the rod.

Figure 2:
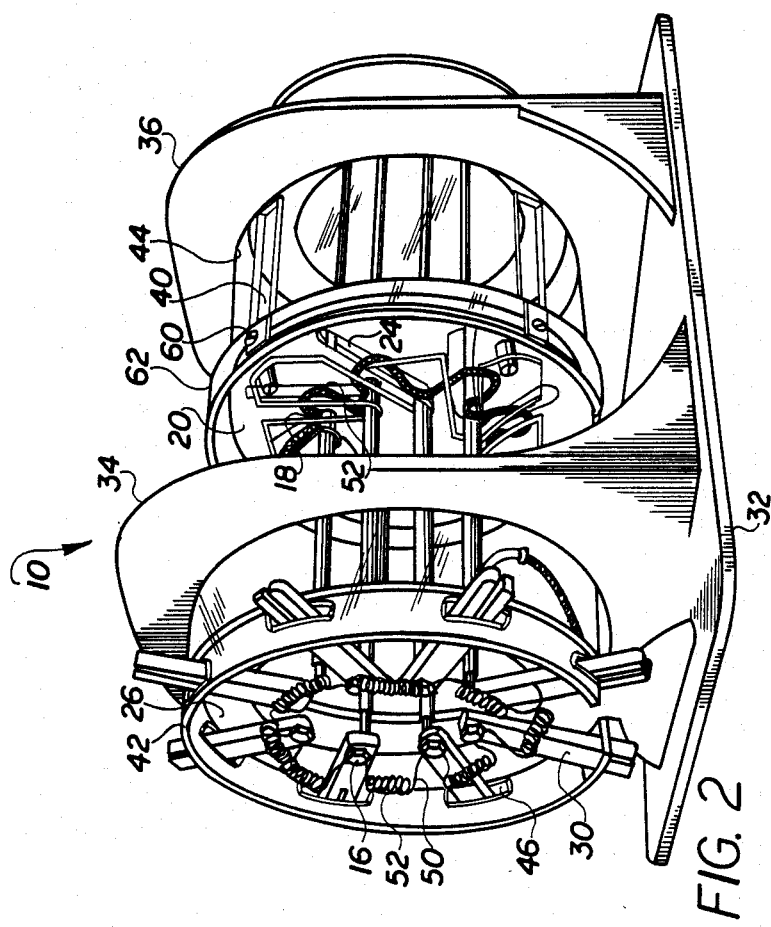
FIG. 2 is a perspective view of an extremity coil with the driver plate in a second position.

In the operation of the preferred embodiment, the coil 10 is tuned to a desired resonant frequency by moving the driver plate 20 along the main axis 14 to a desired position. Referring to FIG. 1, the coil 10 will have a first resonant frequency corresponding to a first capacitance when, for instance, the driver plate 20 is at a fully extended position in the coil 10. The coil 10 has a second resonant frequency and a second corresponding capacitance if the driver plate 20 is moved toward the end ring 26 to a second desired position in the coil 10 as shown in FIG. 2. Each tube 58 that makes up the column 12 moves with the driver plate 20. As the driver plate 20 is moved towards the end ring 26, each tube 58 slides over the corresponding rod 56 narrowing the distance between the end ring 26 and the driver plate 20, resulting in a change in capacitance of the columns 12. Preferably, the tube 58 is open on both sides so the rod 56 can extend through the tube 58 and the tube 58 can slide unencumbered over the rod 56 to a desired position.

Figure 3:
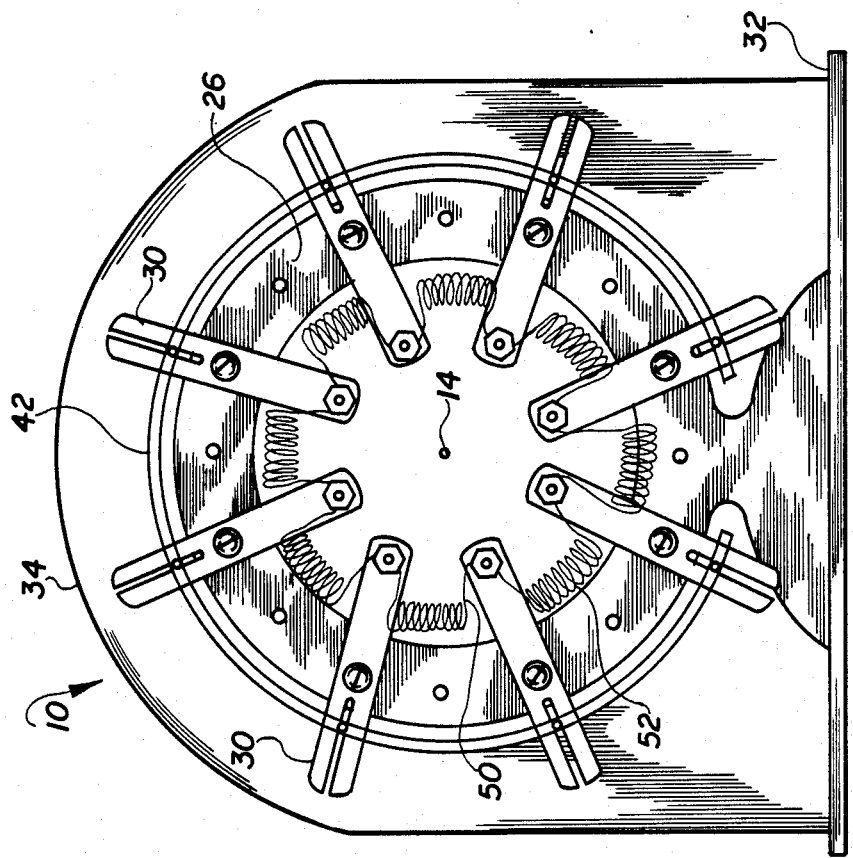
FIG. 3 is an axial view of the extremity coil having a first aperture.
Figure 5:
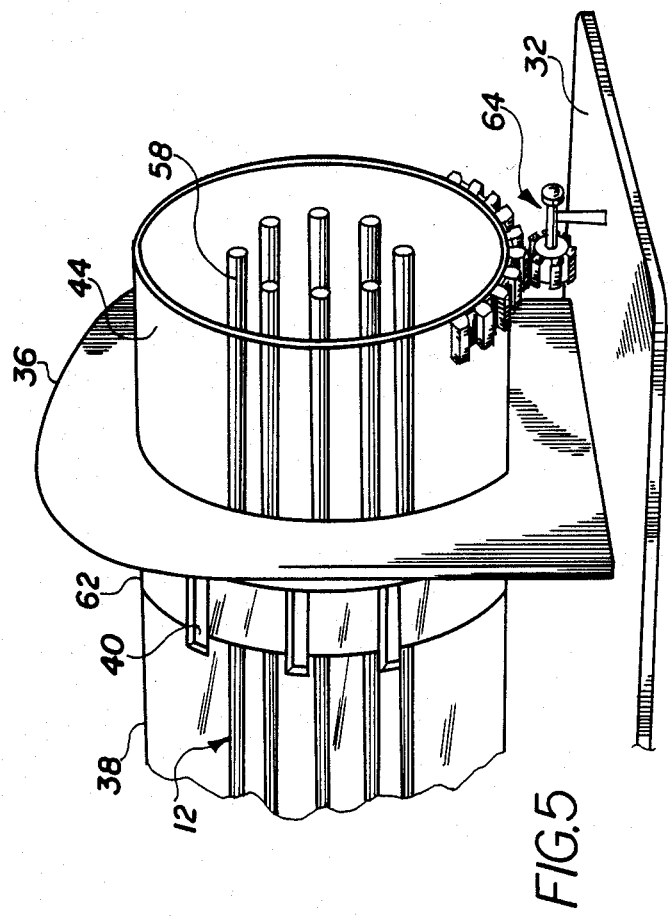
FIG. 5 is a perspective view of an extremity coil which includes a view of a rack and pinion mechanism.

After the desired resonant frequency of the coil 10 is chosen, the aperture of the coil 10 can be chosen. This is accomplished by rotating the main cylinder 38 causing the spokes 30 to rotate about the position at which they are attached to the end ring 26. As the spokes rotate, they move the corresponding columns to which they are attached either further apart or closer together depending on the direction of rotation of the main cylinder 38. The second end of each column which extends into a corresponding slot 24 on the driver plate 20 is free to move along the corresponding slot 24 to a position dictated by the rotation of the main cylinder 38. FIG. 3 shows an axial view of the coil 10 wherein the spokes 30 are positioned such that the aperture of the coil 10 is at its smallest. FIG. 4 is an axial view of the coil 10 with the spokes 30 positioned such that the aperture of the coil 10 is at its largest position. During rotation of the main cylinder 38, the driver plate 20 is fixed relative to its position along the main axis 14. The movement of the driver plate 20 and the main cylinder 38 can be accomplished manually or remotely with the aid of a rack and pinion mechanism 64 as shown in FIG. 5.

Although the invention has been described in detail in the foregoing for the purpose of illustration, it is to be understood that such detail is solely for that purpose and that variations can be made therein by those skilled in the art without departing from the spirit and scope of the invention as described by the following claims.

I claim:

1. An extremity coil for magnetic resonance imaging comprising:
   a plurality of columns disposed about a main axis, said columns being electrically connected to each other at their first ends and said columns being electrically connected to each other at their second ends; means for varying the distance of the columns from the main axis; and means for supporting the coil.

2. An extremity coil as described in claim 1 wherein the varying means includes a driver plate disposed in a plane that is essentially perpendicular to the main axis with the main axis essentially passing through the center of the driver plate, said driver plate having a plurality of slots which extend from a location near the main axis and which are coaxial to the main axis, said second ends of the columns extending into corresponding slots of the driver plate; an end ring disposed in a plane that is essentially perpendicular to the main axis with the main axis essentially passing through the center of the end ring; a plurality of spokes, each of said spokes extend from a location near the main axis and are attached to the end ring such that each spoke is able to swing in a plane that is essentially perpendicular to the main axis, said first ends of the columns attached to corresponding spokes.

3. An extremity coil as described in claim 2 wherein the support means includes a main support plate and a first and second support ring attached to the main support plate, said first and second support rings disposed about the columns such that they support the columns.

4. An extremity coil for magnetic resonance imaging comprising:
   a main cylinder having a first plurality of slots extending lengthwise into the main cylinder from a first end thereof;
   a driver plate, disposed in the main cylinder at the first end thereof and disposed essentially perpendicular to the main axis of the main cylinder with the main axis passing through the center of the driver plate, said driver plate capable of sliding along the first plurality of slots in the main cylinder, said first plurality of slots capable of preventing the driver plate from independently rotating about the main axis, said driver plate having slots which extend from a location near the main axis and which are coaxial to the main axis;
   an end ring disposed in the main cylinder at a second end thereof, and disposed in a plane that is essentially perpendicular to the main axis of the main cylinder with the main axis passing through the center of the end ring;
   a plurality of spokes which extend from a location near the main axis and which are coaxial to the main axis, each of said spokes being attached to the end ring such that each spoke is able to swing in a plane that is perpendicular to the main axis;
   a plurality of columns disposed in the main cylinder and are coaxial to the main axis thereof, said columns extendable with respect to the length and having a capacitance corresponding thereto for tuning the resonant frequency of the coil, each column having a first end attached to a corresponding spoke, and a second end extending into a corresponding slot of the driver plate, the first ends of each column being electrically connected to each other and second ends of each column being electrically connected to each other; and
   means for supporting the main cylinder.

5. An extremity coil as described in claim 4 wherein the main cylinder has a second plurality of slots at the second end thereof, each of said spokes extend from a location near the main axis into a corresponding slot of the second plurality of slots.

6. An extremity coil as described in claim 5 wherein the first ends of the columns are electrically connected to each other by a first connecting ring comprised of flexible inductors, with a flexible inductor connected to the first ends of adjacent columns, and wherein the second ends of the columns are electrically connected to each other by a second connecting ring comprised of flexible inductors, with a flexible inductor connected to the second ends of adjacent columns.

7. An extremity coil as described in claim 6 wherein each column includes an electrically conducting rod and an electrically conducting tube, said rod is disposed in said tube and forms a capacitance therebetween, said capacitance is capable of being varied.

8. An extremity coil as described in claim 7 wherein the means for supporting the cylinder includes a main support plate and a first and second support ring attached to the main support plate, said first and second support rings disposed about the main cylinder such that the main cylinder is rotatably supported by the first and second support rings.

9. An extremity coil as described in claim 8 wherein the driver plate has a plurality of tabs, each of said tabs extending through a corresponding slot of the first plurality of slots in the main cylinder; and there is included a driver cylinder disposed about the main cylinder and connected to the tabs such that the driver cylinder can rotate and slide in concert with the driver plate.

10. An extremity coil as described in claim 9 including a rack and pinion mechanism attached to the main cylinder for rotating the main cylinder.

11. An extremity coil for magnetic resonance imaging comprising:
   a main cylinder having a first plurality of slots extending lengthwise into the main cylinder from a first end thereof, and a second plurality of slots disposed at a second end thereof;
   a driver plate, disposed in the main cylinder at the first end thereof and disposed essentially perpendicular to the main axis of the main cylinder with the main axis passing through the center of the driver plate, said driver plate capable of sliding along the first plurality of slots in the main cylinder, said first plurality of slots capable of preventing the driver plate from independently rotating about the main axis, said driver plate having slots which extend from a location near the main axis and which are coaxial to the main axis, said driver plate having a plurality of tabs, each of said tabs extending through a corresponding slot of the first plurality of slots in the main cylinder;

a driver cylinder disposed about the main cylinder and connected to the tabs such that the driver cylinder can rotate and slide in concert with the driver plate;

an end ring disposed in the main cylinder at the second end thereof, and disposed in a plane that is essentially perpendicular to the main axis of the main cylinder with the main axis passing through the center of the end ring;

a plurality of spokes which extend from a location near the main axis and which are coaxial to the main axis, each of said spokes attached to the end ring such that each spoke is able to swing in a plane that is essentially perpendicular to the main axis, each of said spokes extend from a location near the main axis into a corresponding slot of the second plurality of slots;

a plurality of columns disposed in the main cylinder and are coaxial to the main axis thereof, said columns extendable with respect to length, and having a capacitance corresponding thereto for tuning the resonant frequency of the coil, each column having a first end attached to a corresponding spoke, and a second end extending into a corresponding slot of the driver plate, the first ends of each column being electrically connected to each other by a first connecting ring comprised of flexible inductors, with a flexible inductor connected to the first ends of adjacent columns, and second ends of each column being electrically connected to each other by a second connecting ring comprised of flexible inductors, with a flexible inductor connected to the second ends of adjacent columns, each column includes an electrically conducting rod and an electrically conducting tube, said rod is disposed in said tube and forms a capacitance therebetween, said capacitance is capable of being varied;

a main support plate; and a first and second support ring attached to the main support plate, said first and second support rings disposed about the main cylinder such that the main cylinder is rotatably supported by the first and second support rings.

* * * * *